(12) United States Patent
Koizumi et al.

(10) Patent No.: US 7,825,676 B2
(45) Date of Patent: Nov. 2, 2010

(54) CONTACTOR AND TEST METHOD USING CONTACTOR

(75) Inventors: Daisuke Koizumi, Kawasaki (JP);
Naohito Kohashi, Kawasaki (JP);
Kazuhiro Tashiro, Kawasaki (JP);
Takumi Kumatabara, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 11/798,188

(22) Filed: May 10, 2007

(65) Prior Publication Data

US 2007/0252608 A1    Nov. 1, 2007

Related U.S. Application Data

(63) Continuation of application No. PCT/JP2004/016979, filed on Nov. 16, 2004.

(51) Int. Cl.
*G01R 31/02*      (2006.01)
(52) U.S. Cl. .................. 324/755; 324/754; 439/66
(58) Field of Classification Search ............. 324/754, 324/761, 765, 158.1; 439/65–71, 482
See application file for complete search history.

(56) References Cited

U.S. PATENT DOCUMENTS

| | | | | |
|---|---|---|---|---|
| 4,402,562 A * | 9/1983 | Sado | .................. | 439/91 |
| 4,505,529 A * | 3/1985 | Barkus | .................. | 439/82 |
| 4,793,814 A * | 12/1988 | Zifcak et al. | .................. | 439/66 |
| 5,137,456 A * | 8/1992 | Desai et al. | .................. | 439/66 |
| 6,174,172 B1 * | 1/2001 | Kazama | .................. | 439/66 |
| 6,176,707 B1 * | 1/2001 | Neidich et al. | .................. | 439/66 |
| 6,241,531 B1 * | 6/2001 | Roath et al. | .................. | 439/66 |
| 6,515,496 B2 * | 2/2003 | Felici et al. | .................. | 324/754 |
| 6,981,881 B2 * | 1/2006 | Adachi et al. | .................. | 439/71 |
| 2004/0140821 A1 * | 7/2004 | Lee | .................. | 324/754 |
| 2005/0093559 A1 * | 5/2005 | Mori et al. | .................. | 324/761 |

FOREIGN PATENT DOCUMENTS

| | | |
|---|---|---|
| CN | 1601283 | 3/2005 |
| JP | 07-072212 A | 3/1995 |
| JP | 07-094249 A | 4/1995 |
| JP | 2001-060483 A | 3/2001 |
| JP | 2002-093542 A | 3/2002 |
| JP | 2003-017207 A | 1/2003 |
| JP | 2003-317845 A | 11/2003 |

OTHER PUBLICATIONS

Chinese Office Action Jun. 27, 2008 (English Translation Provided).
"Japanese Office Action" corresponding to Japanese Application No. 2006-544721, with English translation, mailed dated Feb. 23, 2010.

* cited by examiner

*Primary Examiner*—Ha Tran T Nguyen
*Assistant Examiner*—Arleen M Vazquez
(74) *Attorney, Agent, or Firm*—Fujitsu Patent Center

(57) ABSTRACT

A contact terminal formed of an electrically conductive material is arranged in each of a plurality of holed of a contactor substrate. An electrically conductive part is formed on an inner surface of each hole. The contact terminal has a first contact part that contacts a terminal of an electronic part and a second contact part that contacts the electrically conductive part in a middle portion. When the contact terminal bends by the first contact part being pressed, the second contact part contacts the electrically conductive part of the contactor substrate and an appropriate degree of contact pressure is obtained.

17 Claims, 10 Drawing Sheets

CONTACTOR AND TEST METHOD USING CONTACTOR

CROSS-REFERENCE TO RELATED APPLICATION

This application is a U.S. continuation application, filed under 35 USC 111(a) and claiming the benefit under 35 USC 120 and 365(c), of PCT application JP2004/016979 filed Nov. 16, 2004. The foregoing application is hereby incorporated herein by reference.

BACKGROUND OF THE INVENTION

1. Field of the Invention

The present invention relates to contactors and, more particularly, to a contactor used for a characteristic test of electronic parts such as a semiconductor device and a test method using the contactor.

2. Description of the Related Art

In recent years, a demand for miniaturization and weight-saving to electronic equipments such as a portable communication terminal, a cellular phone, a digital camera, etc., have become strong.

As a semiconductor device satisfying such a demand, there is used a semiconductor device referred to as a chip-size package (CSP: Chip Size Package), which is packaged into almost the same size as an IC chip. As a representative example of the CSP, there are FBGA (Fine-pitch Ball Grid Array), FLGA (Fine-pitch Land Grid Array), etc.

On the other hand, in a central arithmetic device of a computer, such as a CPU (Central Processing Unit), a number of external connection terminals has been increasing due to improvement in a degree of integration. As a result, unlike the above-mentioned CSP, an outer configuration of a CPU is enlarged and a pitch of the external connection terminals (electrodes) is decreased further. As an IC package used for a CPU, there are BGA (Ball Grid Array), LGA (Land Grid Array), etc.

Although the configuration of semiconductor devices and the configuration and size of external connection terminals vary widely and many kinds of semiconductor devices have been put on the market as mentioned above, miniaturization, weight-saving and improvement in a degree of integration have been attempted in each of the semiconductor devices and miniaturization of electrodes and reduction in an electrode pitch have been attempted.

Those semiconductor devices are subjected to a characteristic test in a manufacturing process, and it is necessary to acquire an electric conduction temporarily with external connection terminals when performing the characteristic test. In order to electrically connect a semiconductor device and a test circuit, generally, a contactor is used. In association with the miniaturization of external connection terminals of a semiconductor device and reduction in a pitch as mentioned above, it is necessary to miniaturize contact terminals of a contactor and reduce a pitch.

Here, an example of a conventional contactor is shown in FIG. 1. A contactor 2 shown in FIG. 1 is one used in a characteristic test of a semiconductor device 4 of BGA type, and has a plurality of contact pins 6. Each of the contact pins 6 has a contact part that contacts an external connection terminal 4a of the semiconductor device 4 and a contact part that is connected to an electrode part 8a of a test circuit board 8. It is a structure in which the contact pins 6 are bent by the semiconductor device 4 being pressed from above so that an appropriate contact pressure is applied to the external connection terminals 4a of the semiconductor device 4 and the electrode parts 8a of the test circuit board 8

The following patent documents, for example, are listed as a document relevant to the background art of the present invention.

[Patent Document 1] Japanese Laid-Open Patent Application NO. 7-72212

[Patent Document 2] Japanese Laid-Open Patent Application NO. 7-94249

When performing a characteristic test of a semiconductor device using a conventional contactor using the above, particularly in a characteristic test of a high-frequency device, a length of a contact pin itself becomes a capacitance (inductance), which becomes a noise generating source when performing the high-frequency characteristic test, and there is a case where a sufficient characteristic test cannot be performed.

That is, an end of the conventional contact pin is pressed by an electronic part and the contact pin bends by a degree corresponding to the press, and an opposite end of the contact pin contacts and is pressed by a terminal of a test circuit board, and a conduction path between the electric part and the test circuit board is formed. If such a conventional contact pin is used for a contactor for testing, for example, an analog system high-frequency device, the length of the contact pin becomes a capacitance (inductance), which becomes causes of noise generation, cross-talk generation or the like.

Therefore, in order to reduce a length of a contact pin, that is, a conduction path length of a contact terminal, there are suggested contactors having various shapes, however, under the condition where a high-frequency band has been raised year by year, there have increasing a number of cases where it is difficult to perform a characteristic test with a contactor using the conventional contact pins. Additionally, it becomes impossible to acquire a bend amount (stroke) of a contact terminal sufficiently due to shortening the conduction path, and there also is a problem in that it cannot be applied to an automatic conveyance apparatus (a test handler or the like) in a mass-production time.

SUMMARY OF THE INVENTION

It is a general object of the present invention to provide an improved and useful contactor in which the above-mentioned problems are eliminated.

A more specific object of the present invention is to provide a contactor which permits a characteristic test according to a high-frequency characteristic test by shortening a transmission distance from an external connection terminal of an electronic part to be contacted to a test circuit board and a test method using such a contactor.

In order to achieve the above-mentioned objects, there is provided according to one aspect of the present invention a contactor for electrically connecting terminals of an electronic part to an external circuit, comprising: a contactor substrate having a plurality of holes; contact terminals each of which is formed by an electrically conductive material and being inserted into each of the holes of the contactor substrate so that a part protrudes from the hole; and an electrically conductive part formed on an inner surface of each of the holes, wherein each of said contact terminals has a first contact part that contacts a respective one of said terminals of said electronic part and a second contact part that contacts said electrically conductive part at a middle portion so as to be electrically connected to said external circuit.

In the contactor according to the present invention, it is preferable that a first end portion of said contact terminal forms said first contact part and a second end portion opposite to the first end portion of said contact terminal has a generally V-shape, the middle portion between the first end portion and the second end portion being bent, and the second contact part contacting said electrically conductive part being provided in the middle portion.

Additionally, said contactor substrate may include a first circuit board connected to said external circuit and an insulating substrate formed of an insulating material; the first circuit board and the insulating substrate may be stacked; said hole may extend to the insulating substrate by penetrating through the first circuit board; and said electrically conducting part may be provided on an inner surface of said hole formed in said first circuit board.

Further, said second end portion of said contact terminal may be arranged in said hole formed in said insulating substrate, and an extreme end of said second end portion of said contact terminal may contact the inner surface of said hole formed in said insulating substrate.

Additionally, a bent part may be provided between said first end portion and said middle portion of said contact terminal, and the bent part may contact the inner surface of said hole on a side opposite to said second contact part.

In the contactor according to the present invention, said contactor substrate may include a first circuit board, an insulating substrate formed of an insulating material and a second circuit board; the first circuit board, the insulating substrate and the second circuit board are stacked; said hole may extend by penetrating through the first circuit board and the insulating substrate; said electrically conductive part may be provided on an inner surface of said hole formed in said first circuit board; said second circuit board may have a terminal at a position corresponding to a bottom part of said hole; and said second end portion of said contact terminal may have a third contact part that contacts the terminal. In this case, said second end portion of said contact terminal may be arranged in said hole formed in said insulating substrate, and an extreme end of said second end portion of said contact terminal may contact the inner surface of said hole formed in said insulating substrate. Additionally, a bent part may be provided between said first end portion and said middle portion of said contact terminal, and the bent part may contact the inner surface of said hole on a side opposite to said second contact part.

In the above-mentioned contactor, an external circuit connected to said first circuit board may be a processing circuit of a signal of which transmission rate is high, and an external circuit connected to said second circuit board may be a circuit having a transmission rate lower than the processing circuit. Or, said first circuit board and said second circuit board mat be set to be the same electric potential, and said first circuit board and said second circuit board may be connected based on the Kelvin wiring.

Additionally, in the contactor according to the present invention, said contactor substrate may include a plurality of first circuit boards, a plurality of insulating substrates formed of an insulating material and a second circuit board; the plurality of first circuit boards and the plurality of insulating substrates are stacked alternately; said hole may extend to the second circuit board by penetrating through the first circuit boards and the insulating substrates; said electrically conductive part may be provided on an inner surface of said hole formed in said first circuit boards; said second circuit board may have a terminal at a position corresponding to a bottom part of said hole; and said second end portion of said contact terminal may have a third contact part that contacts the terminal. In this case, said second contact part of said contact terminal may be provided selectively at a position to contact said electrically conductive film formed in one of said plurality of first circuit boards. Additionally, said second end portion of said contact terminal may be arranged in said hole formed in said insulating substrates, and an extreme end of said second end portion of said contact terminal may contact the inner surface of said hole formed in said insulating substrates.

Additionally, in the contactor according to the present invention, said contactor substrate may include a first circuit board, an electrically conductive substrate formed of an electrically conductive material and a second circuit board; the first circuit board, the electrically conductive substrate and the second circuit board are stacked; said hole may extend to said second circuit board by penetrating through the first circuit board and the electrically conductive substrate; said electrically conductive part may be provided on an inner surface of said hole formed in said first circuit board; and an insulating part formed of a dielectric material may be provided on the inner surface of said hole of said electrically conductive substrate. In this case, said second end portion of said contact terminal may be arranged in said hole formed in said electrically conductive substrate, and an extreme end of said second end portion of said contact terminal may contact said insulating part of said electrically conductive substrate. Additionally, a bent part may be provided between said first end portion and said middle portion of said contact terminal, and the bent part may contact the inner surface of said hole on a side opposite to said second contact part.

Further, in the contactor according to the present invention, said first circuit board may further has a land part that extends from said electrically conductive part formed on the inner surface of said hole and formed on a flat surface of said first circuit board, and an extreme end of said second end portion of said contact terminal may contact the land part.

Additionally, in the contactor according to the present invention, a first end portion of said contact terminal may have a generally V-shape to form said first contact part; a middle portion between the first end portion and a second end portion opposite to the first end portion may be bent; a second contact part that contacts said electrically conductive part may be provided in the middle portion; and an extreme end of said first contact part may contact the land part that extends from said electrically conductive part and formed on a surface of said contactor substrate.

Additionally, there is provided according to another aspect of the present invention a test method using a contactor, comprising: pressing an electrode of an electronic part onto a first end portion of a contact terminal protruding from a hole of a substrate; causing the contact terminal to bend by the pressing force so as to cause a middle portion between said first end portion and a second end portion opposite to said first end portion of said contact terminal to contact an electrically conductive part provided on an inner surface of the hole of the substrate; and performing a test by electrically contacting said electronic part and a circuit board.

As mentioned above, according to the present invention, since each contact terminal is caused to bend at a middle portion by pressing one end of the contact terminal so as to acquire conduction with a bent portion serving as a contact point, the length of the conduction path is a part between the one end of the contact terminal and the middle portion. Accordingly, the length of the conduction path becomes shorter than the length between the opposite ends of the contact terminal, which can reduce noise generation and cross-talk generation due to the inductance of the contact terminal.

Other objects features and advantages of the present invention will become more apparent from the following detailed description when read in conjunction with the accompanying drawings.

DETAILED DESCRIPTION OF THE PREFERRED EMBODIMENTS

Figure 1:
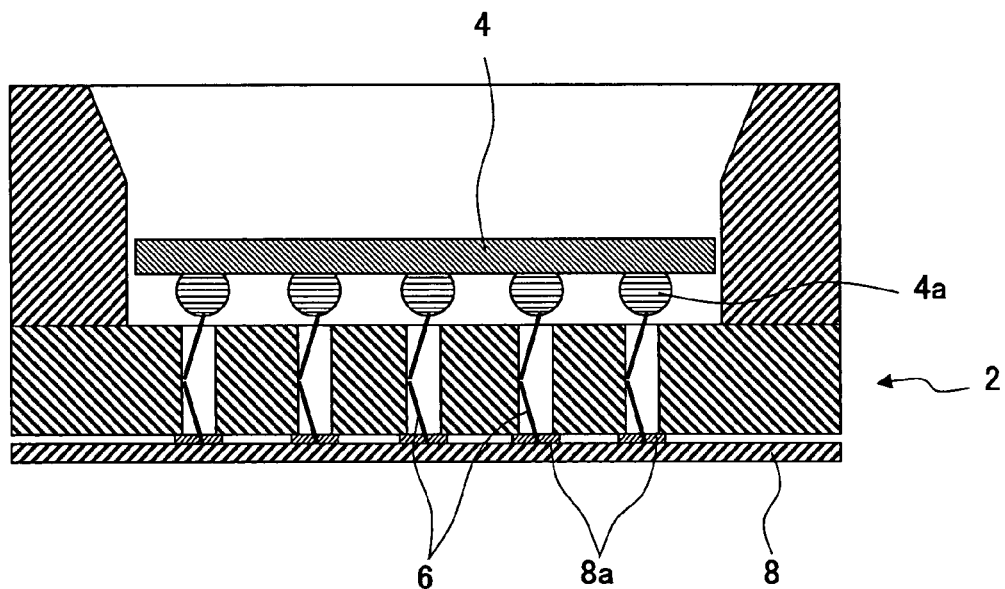
FIG. 1 is a cross-sectional view showing an example of a conventional contactor.
Figure 2:
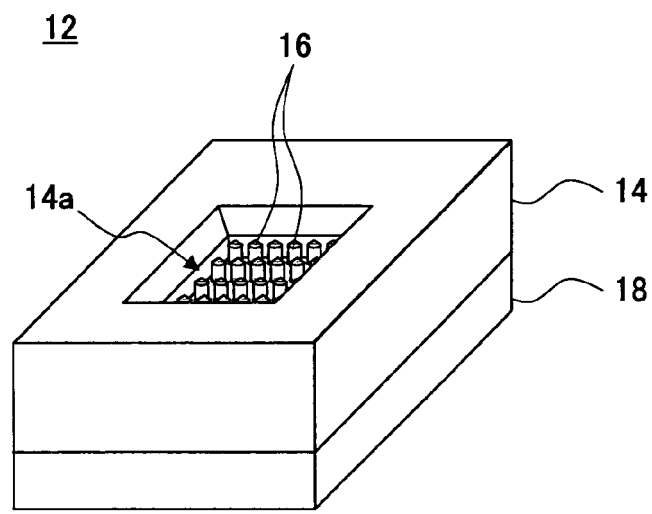
FIG. 2 is a perspective view showing an entirety of a contactor.
Figure 3:
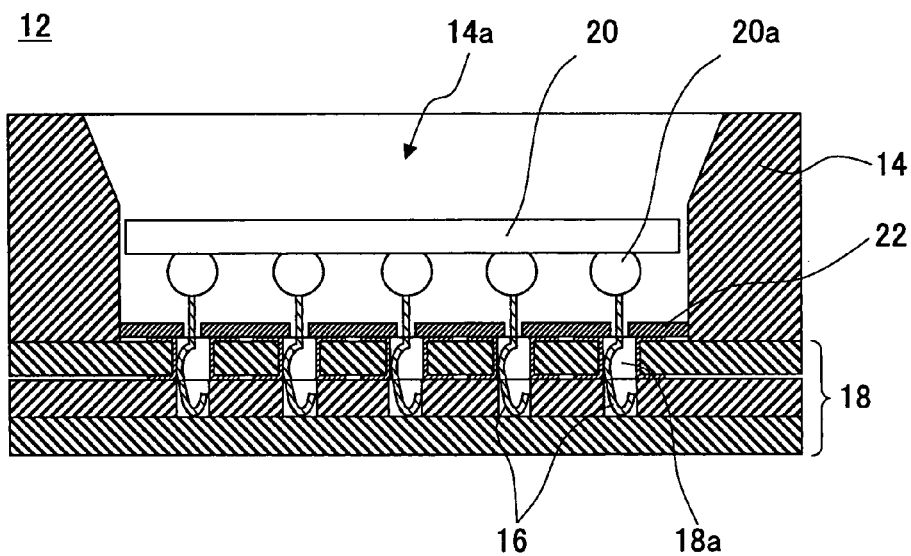
FIG. 3 is a cross-sectional view of the contactor shown in FIG. 2.

First, a description will be given, with reference to FIG. 2 and FIG. 3, of an entire structure of a contractor according to the present invention. FIG. 2 is a perspective view showing an entirety of a contactor. FIG. 3 is a cross-sectional view of the contactor shown in FIG. 2.

As shown in FIG. 2, the contactor 12 comprises a housing 14 having an opening part 14a into which a semiconductor device is inserted and a contactor substrate 18 provided with a plurality of contact terminals (contact pins) 16. End portions of the contact terminals 16 are exposed within the opening part vent 14a. By contacting and pressing the end portions of the contact terminals 6 to external connection terminals of the semiconductor device such as an LSI as an electronic part which is an object to be tested, the external connection terminals of the semiconductor device and terminals of a circuit board contained in the contactor substrate 18 are electrically connected.

As specifically shown in FIG. 3, a plural number of external connection terminals 20a such as, for example, solder balls or bumps, are provided on the back surface of the semiconductor device 20, and the semiconductor device 20 is arranged in the opening part 14a of the housing 14 in a state where the external connection terminals 20a face downward.

Therefore, the external connection terminals 20a contact extreme ends of the contact terminals 16 protruding in the opening part 14a.

Each of the contact terminals 16 is arranged individually in a hole of the contactor substrate 18. It is so configured and arranged that the semiconductor device 20 is pressed and the contact terminals 16 bend by the pressing force and an appropriate contact pressure can be obtained when a cover (not shown in the figure) of the housing 14 is closed in a state where the external connection terminals 20a of the semiconductor device 20 are in contact with the extreme ends of the contact terminals 16.

It should be noted that an alignment board 22 provided with positioning holes of the contact terminals 16 is arranged on an upper side of the contactor substrate 18. The contact terminals can maintain the upright state while the protruding extreme ends are retained by the holes of the alignment board 22 in a state where the contact terminals are in the holes of the contactor substrate 18. It should be noted that the alignment board 22 is not always necessary to provide if the contact terminals 16 are configured to be arranged in self-standing in the holes 18a of the contactor substrate 18.

Figure 4:
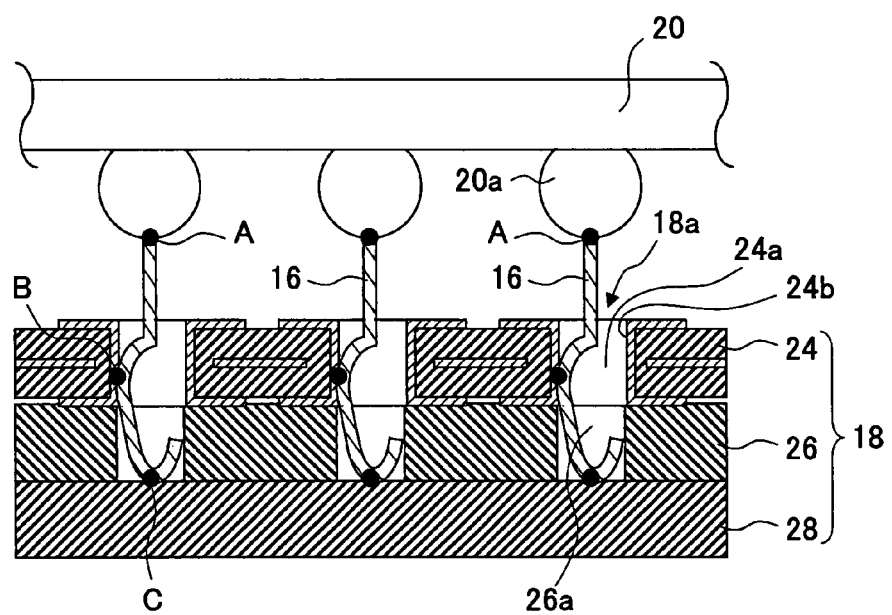
FIG. 4 is an enlarged cross-sectional view of a portion of a contactor according to a first embodiment of the present invention in which contact terminals are provided.

Next, a description will be given, with reference to FIG. 4, of a contactor according to a first embodiment of the present invention. FIG. 4 is an enlarged cross-sectional view of a part of a contactor according to the first embodiment of the present invention in which contact terminals are provided.

In FIG. 4, the contact terminals 16 are arranged in the holes 18a of the contact substrate, and extreme ends protrude from the holes 18a. The extreme ends of the contact terminals 16 contact the external connection terminals 20a of the semiconductor device 20 in first contact parts A.

The contactor substrate 18 includes a test circuit board 24 and insulating substrates 26 and 28. The test circuit board 24 has through holes 24a, which are parts of the holes 18a of the contactor substrate in which the contact terminals 16 are arranged, and inner surfaces of the through holes 24a are covered by electrically conductive films 24b such as, for example, a copper plating film, so that electrically conductive parts are formed. The test circuit board 24 is a multi-layer substrate, and the electrically conductive films 24b of the inner surfaces of the above-mentioned through holes 24 are connected to a pattern circuit formed in an interior of the test circuit board 24. Then, the pattern circuit is connected to a test circuit for performing an electric characteristic test of the semiconductor device 20 so that the test of the semiconductor device is performed.

The insulating substrate 26 has holes 26a, which are parts of the holes 18a of the contactor substrate 18, and is formed of an insulating material. Additionally, the insulating substrate 28 is provided so as to form bottom surfaces of the holes 18a of the contactor substrate, and is formed of an insulating material similar to the insulating substrate 26. Although the insulating substrate 26 and the insulating substrate 28 are arranged to overlap with each other in the present embodiment, they can be a single sheet insulating substrate by forming holes having bottom surfaces in a single sheet of insulating material board.

The contact terminals 16 are formed of an electrically conductive material such as, for example, a copper material of an elongated plate-like shape or bar-like shape, and has a first end portion extending straight, a middle portion which is bent, and a second end portion bent in a generally V-shape on a side opposite to the first end portion.

In the contactor of the above-mentioned structure, the contact terminal 16 arranged in the hole 18a of the contactor substrate 18 have the first contact part A, in which the extreme end of the first end portion protruding from the hole 18a contacts the external connection terminal 20a of the semiconductor device 20. Then, the bent middle portion is configured to be in contact with an inner surface of the through hole 24a of the test circuit board 24, and this part serves as a second contact part B. That is, the contact terminal 16 has an electric contact point (second contact part B) in the middle portion between the opposite ends (the first end portion and the second end portion) in a longitudinal direction.

Although the second end portion of the contact terminal 16 bent in generally V-shape forms a third contact part C in the present embodiment, it does not function as an electric contact point. By the second end portion being bent in a generally V-shape, the second end portion of the contact terminal 16 contacts the inner surface of the hole 18a (hole 26a) on the opposite side of the second contact part so as to not move within the hole 18a when the contact terminal is pressed and bent (deformed), which prevents the contact terminal 16 from slanting due to movement of the second end portion moving in a transverse direction.

As mentioned above, in the present embodiment, a portion of the contact terminal 16 between the first contact part A in the first end portion and the second contact part B in the middle portion serves as a conduction path, and the conduction path is shorter than a conventional contact terminal. Accordingly, a transmission path from the external connection terminal 20a of the semiconductor device 20 to the test circuit board 24 is shortened, which permits a high-frequency characteristic test in a good condition. Additionally, interfusion of noise and generation of cross-talk can be reduced.

Figure 5:
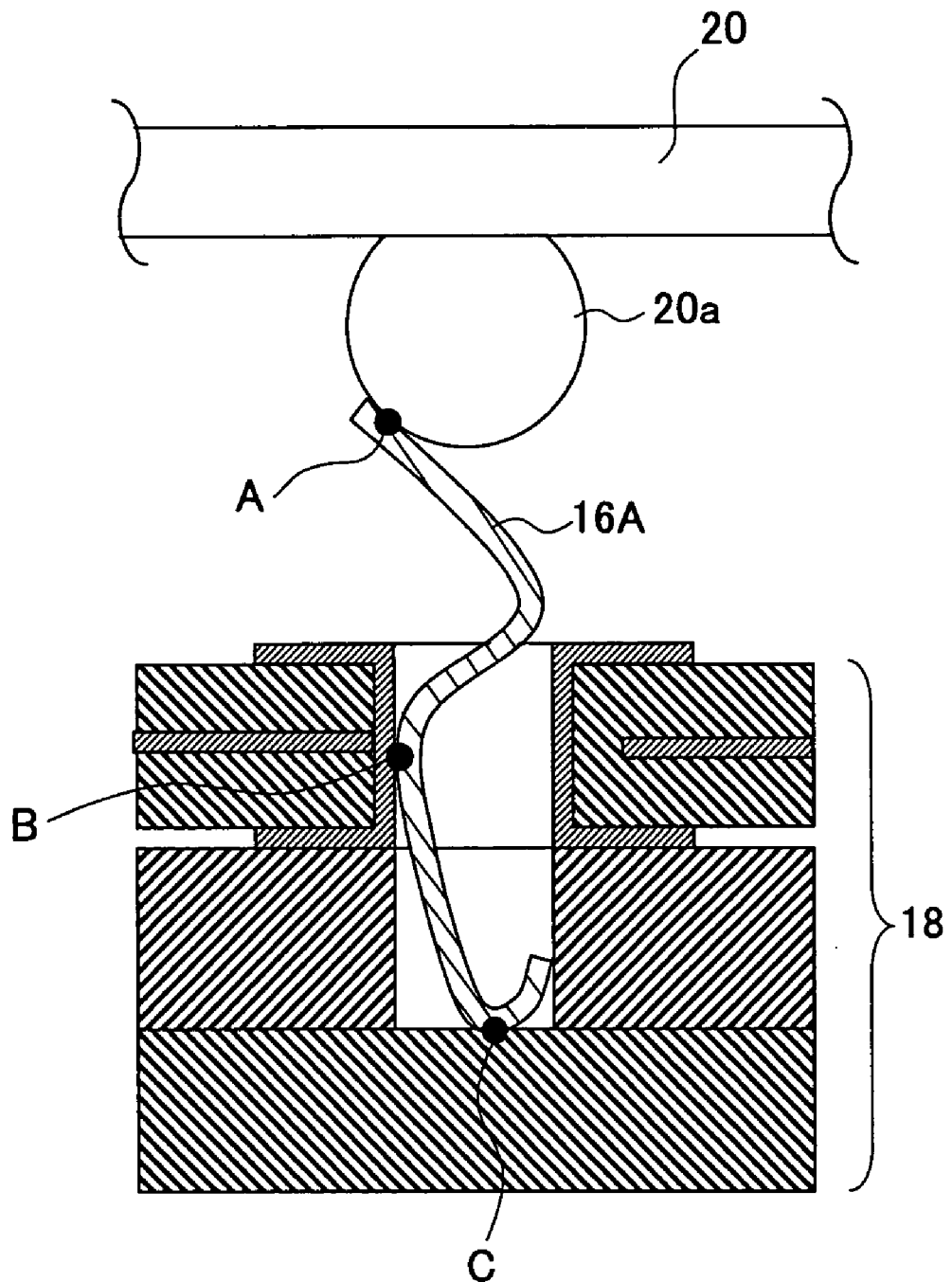
FIG. 5 is a cross-sectional view showing a variation of the contact terminal shown in FIG. 4.

It should be noted that in FIG. 4, the alignment board 22 (refer to FIG. 3) that supports the first end portion of the contact terminal 16 is omitted. Additionally, instead of providing the alignment board 22, a contact terminal 16A may be arranged by self-standing in the hole 18a by further bending the first end portion of the contact terminal 16 as the contact terminal 16A shown in FIG. 5 so as to cause it to contact the inner surface of the hole 18a on the opposite side of the second contact part B. In this case, the conduction path of the contact terminal 16A is further shorter than the contact terminal 16. It should be noted that the shape of the contact terminal 16A may be used also in other embodiments mentioned below.

Figure 6:
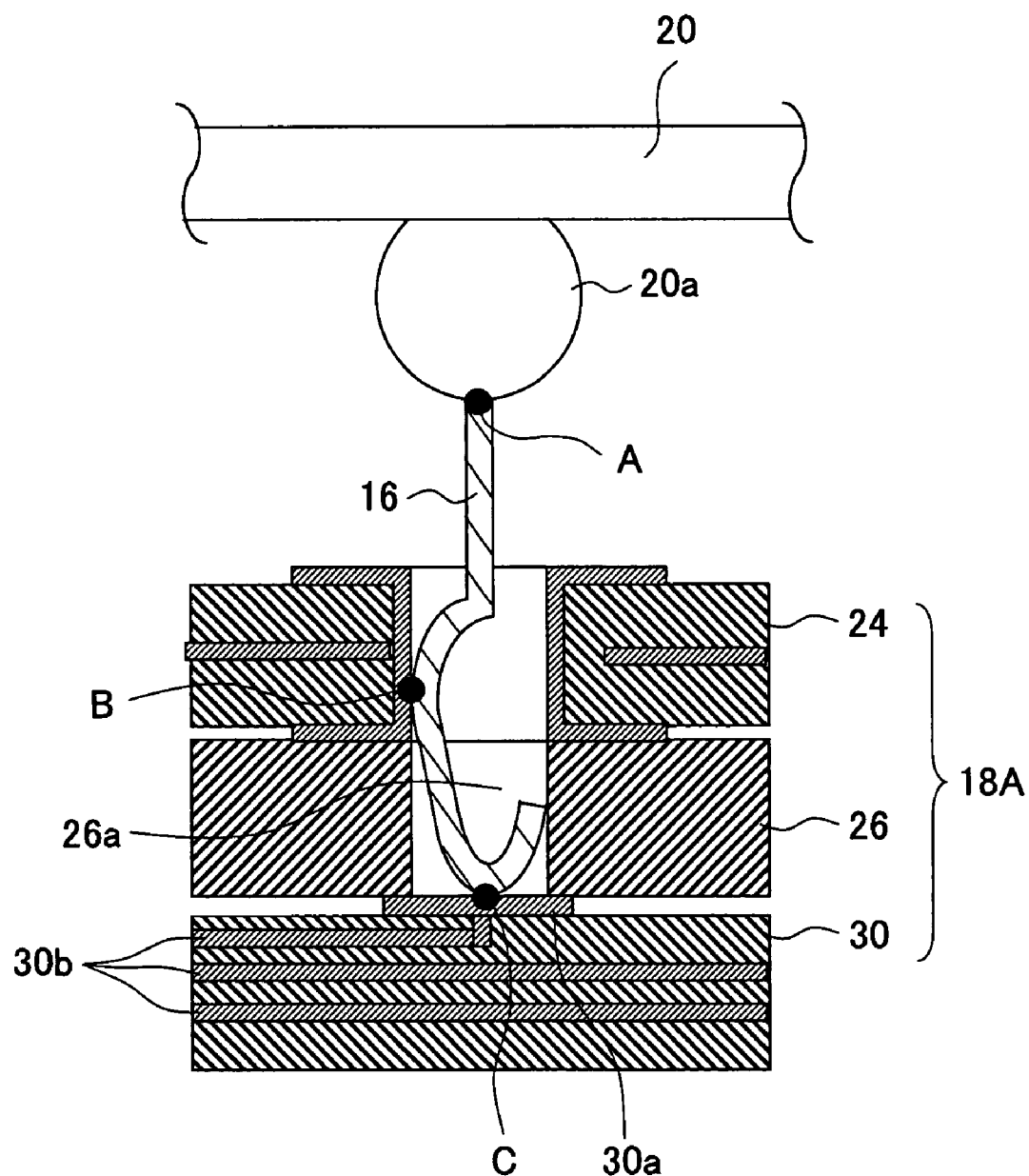
FIG. 6 is an enlarged cross-sectional view of a portion of a contactor according to a second embodiment of the present invention in which contact terminals are provided.

Next, a description will be given, with reference to FIG. 6, of a contactor according to a second embodiment of the present invention. FIG. 6 is an enlarged cross-sectional view of a part of a contact terminal of the contactor according to the second embodiment of the present invention. In FIG. 6, parts that are the same as the part shown in FIG. 4 are given the same reference numerals, and descriptions thereof will be omitted.

The contactor according to the second embodiment of the present invention is one in which the insulating substrate 28 constituting the contactor substrate 18 in the contactor according to the above-mentioned first embodiment with a test circuit board 30, and structures other than that are the same as the contactor according to the first embodiment. Accordingly, the contactor substrate 18A of the contactor according to the present embodiment has the test circuit board 24 (hereinafter, referred to as a first test circuit board), the insulating substrate 26 and the test circuit board 30 (hereinafter, referred to as a second test circuit board).

The second test circuit board 30 has a terminal 30a in a portion corresponding to a bottom surface of the hole 18a of the contact substrate 18. The terminal 30a is connected to a pattern circuit 30b formed in the second test circuit board 30, and is connected to a test circuit via the pattern circuit 30b.

Figure 7:
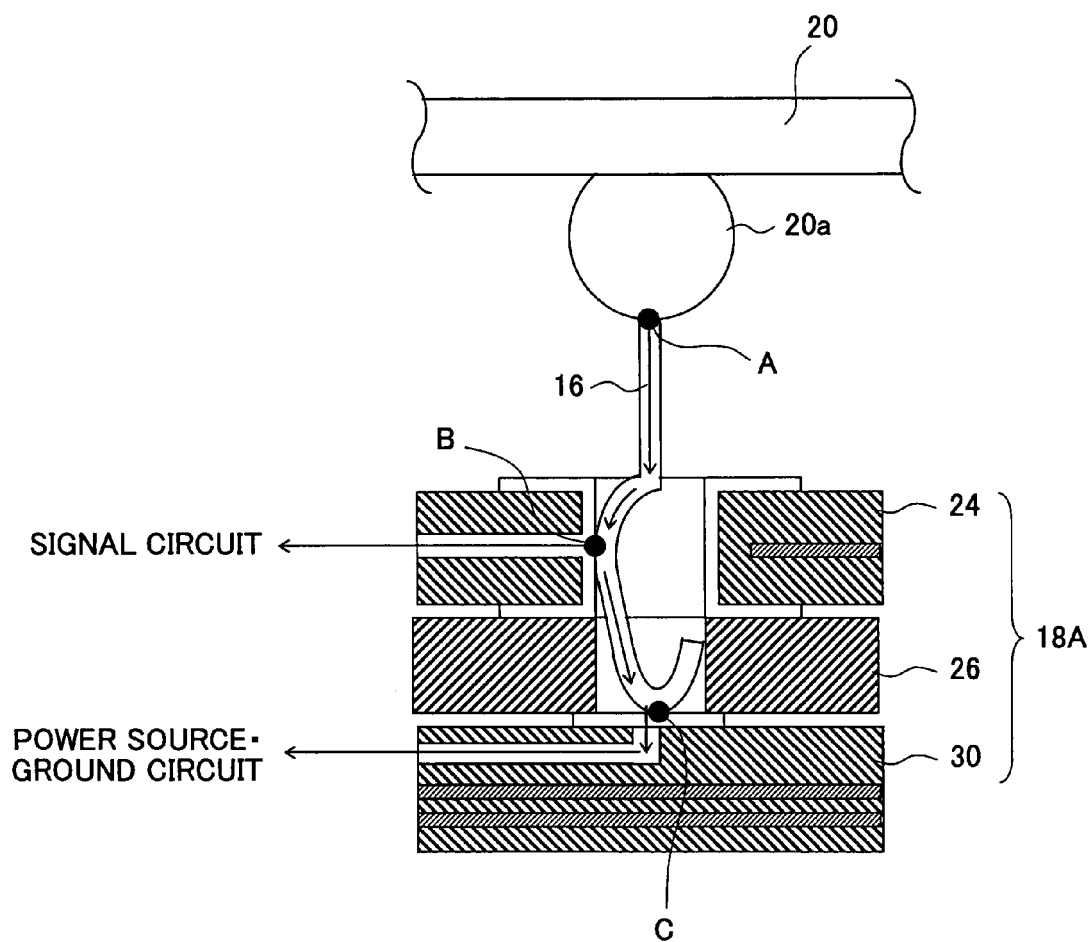
FIG. 7 is a cross-sectional view showing a conduction path of the contactor shown in FIG. 6.

FIG. 7 is a cross-sectional view showing a conduction path of the contactor shown in FIG. 6. As shown in FIG. 7, for example, an electric circuit of a signal system is incorporated into the first test circuit board 24 and the conduction path through which a high-frequency signal passes is caused to be a short conduction path, and a path (for example, a power source path or a ground path) of which operation frequency is not high is formed in the second test circuit board 30. That is, a signal path of which conduction path is preferably short is formed in the first test circuit board 24 through the second contact part B, a signal path of which conduction path can be long is formed in the test circuit board 30 through the third contact part C, and is connected to the power source or the ground circuit.

Figure 8:
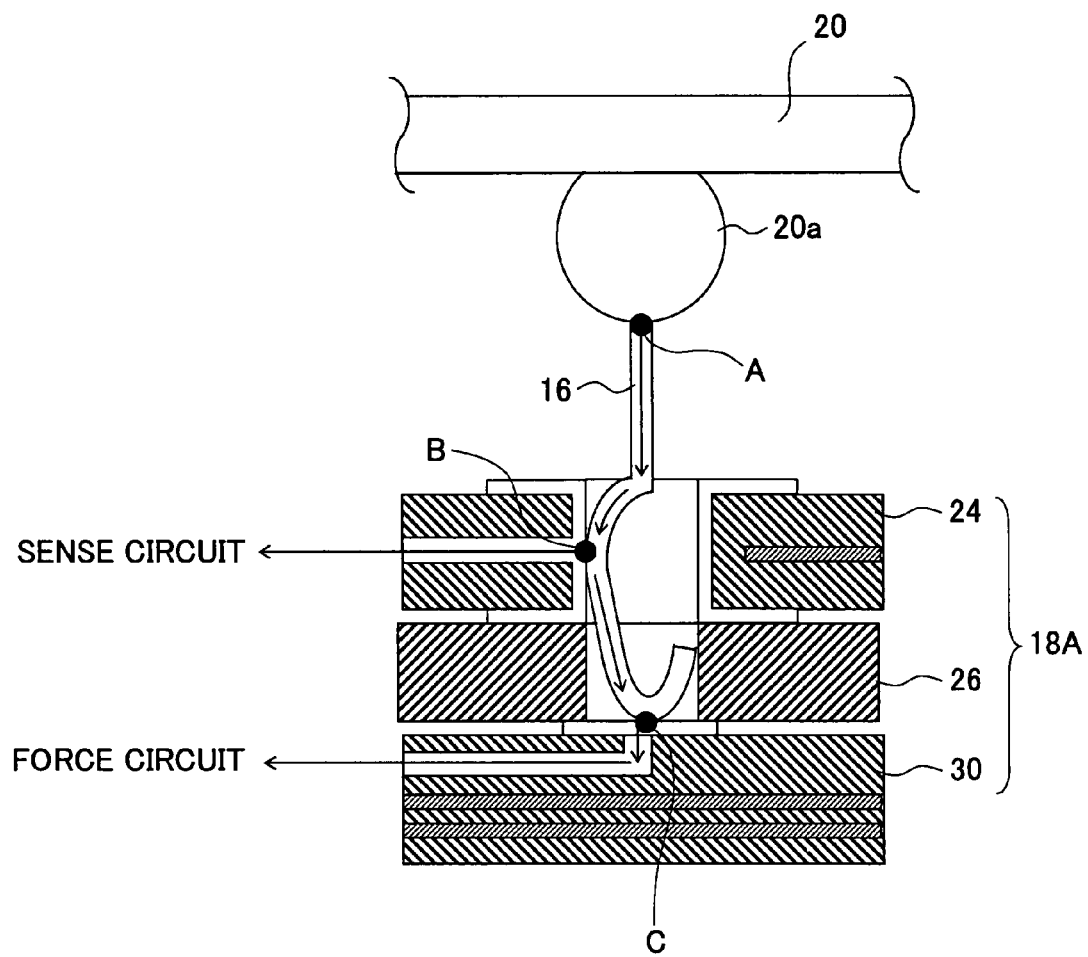
FIG. 8 is a cross-sectional view showing a conduction path of the contactor shown in FIG. 6.

Or, as shown in FIG. 8, the first test board 24 and the second test circuit board 30 may be set to be at the same potential, and a connection may be made to the sense circuit through the first test circuit board 24, and a connection may be made to the force test circuit through the second test circuit board 30. Thereby, a test according to the Kelvin measurement (four-point measurement) can be performed.

Figure 9:
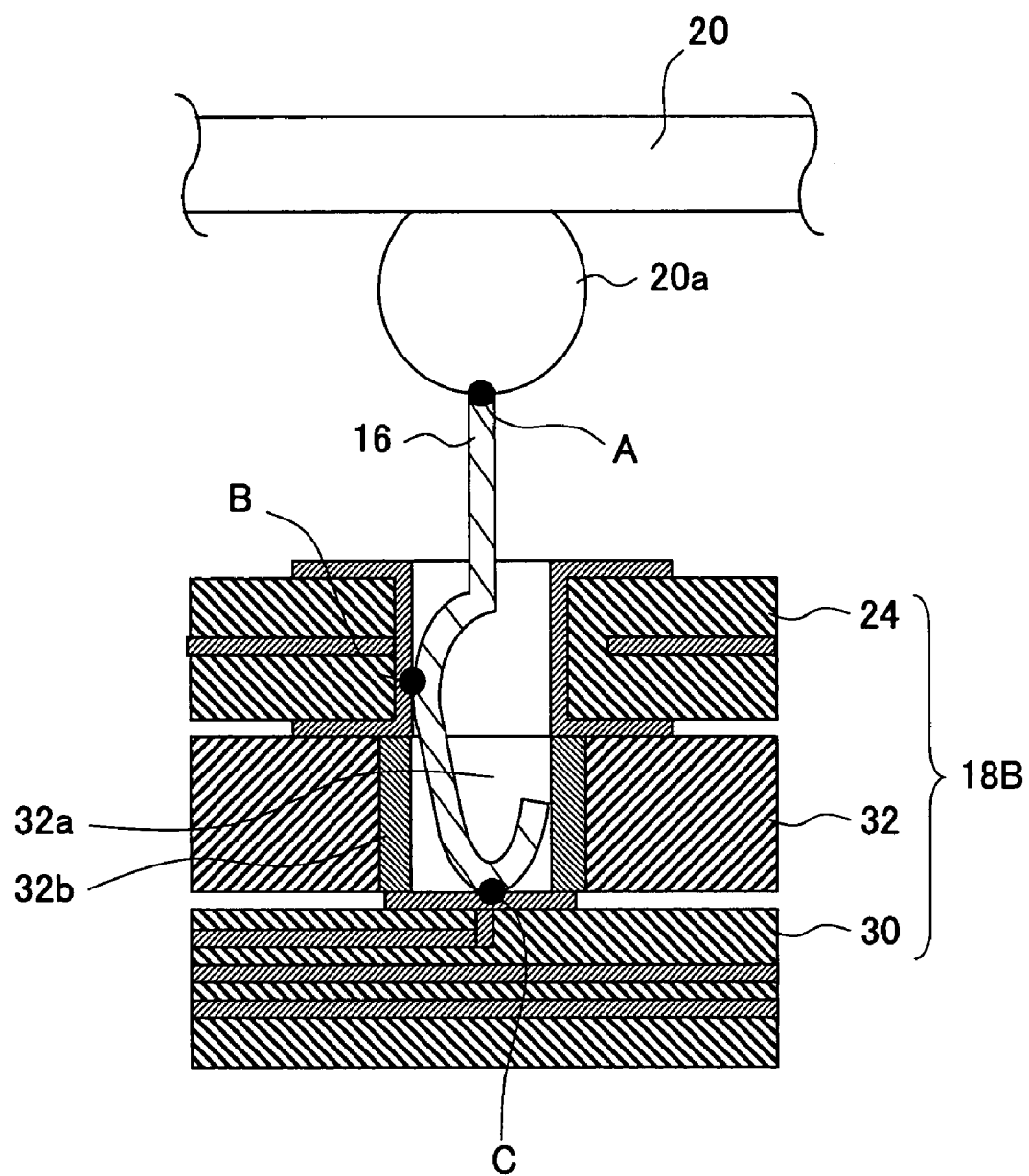
FIG. 9 is a cross-sectional view showing a portion of a contactor provided with contact terminals in which an insulating substrate shown in FIG. 6 is replaced by a conductive substrate.

Moreover, generation of noise and cross-talk can be reduced by replacing the insulating substrate 26 of the above-mentioned contactor substrate 18 with a conductive substrate. FIG. 9 is a cross-sectional view showing a part in which a contact terminal of the contactor of which the insulating substrate 26 shown in FIG. 6 is replaced with a conductive substrate is provided.

The conductive substrate 32 provided instead of the insulating substrate 12 is formed of a conductive material consisting of a metal such as copper, a copper ally, a stainless steel, etc., and has a hole 32a for accommodating the contact terminal similar to the insulating substrate 26. An inner surface of the hole 32a is covered by an insulating part 32b made of a dielectric material. It is preferable that, as the dielectric material, for example, a low dielectric constant material represented by a fluorocarbon resin such as PTFE (Poly Tetra Fluoro Ethylene) used for a coaxial cable etc., is used.

A periphery of the contact terminal 16 can be a coaxial structure by forming the contactor 18B using the conductive substrate 32 having the above-mentioned structure and connecting the conductive substrate 32 to the ground terminal or the power source terminal of the first test board circuit 24 or the second test board circuit 30. Thereby, impedance matching of the contact terminal 16 can be attempted and generation of noise and generation of cross-talk can be reduced. There is a case where a noise is generated due to interference between contact terminals when a device having a high-operation frequency such as, for example, an analog device is operated at an input signal, but the interference between the contact terminals can be prevented and generation of noise and generation of cross-talk can be reduced by surrounding an inner surface of the hole 32a by the dielectric material 32b as mentioned above.

It should be noted that the material of the insulating part 32b is not limited to the above-mentioned fluorocarbon resin, and various dielectric materials matching a test characteristic can be selected.

Figure 10:
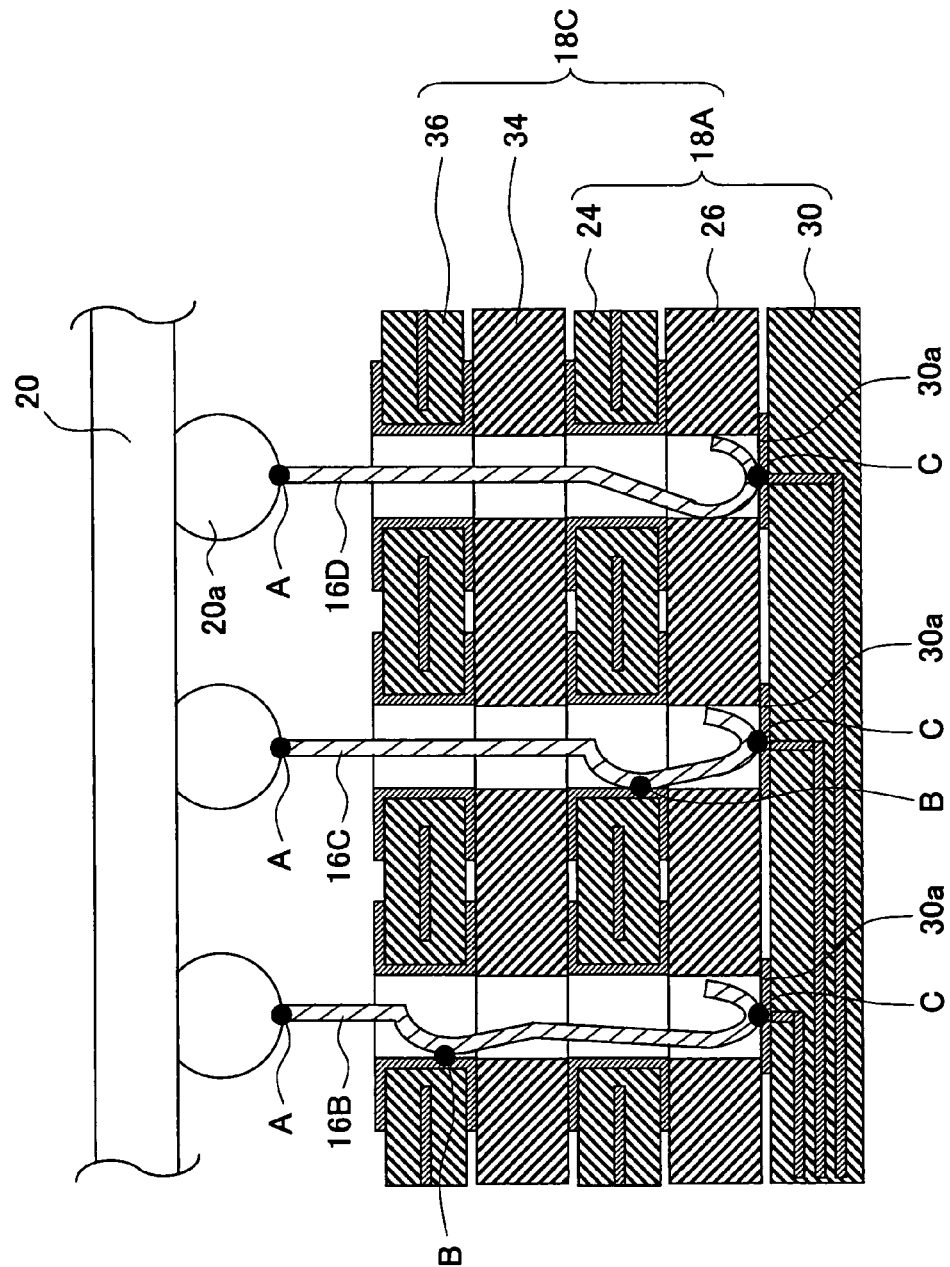
FIG. 10 is an enlarged cross-sectional view of a portion of a contactor according to a third embodiment of the present invention in which contact terminals are provided.

Next, a description will be given, with reference to FIG. 10, of a third embodiment of the present invention. FIG. 10 is an enlarged cross-sectional view of a part provided with a contact terminal of a contactor according to the third embodiment. It should be noted that although there are shown three kinds of contact terminals 16B, 16C and 16D having different shapes in FIG. 10, there is no need to use all of those and may be used by selecting if necessary.

The contactor substrate 18A shown in FIG. 10 is one in which an insulating substrate 34 and a test circuit board 36 are provided further on the contactor substrate 18A shown in FIG. 6. The insulating substrate 34 has the same structure as the insulating substrate shown in FIG. 6, and also the test circuit board 36 has the same structure as the test circuit board shown in FIG. 6.

In FIG. 10, the contact terminal 16B shown on the left side is formed with a long middle portion, and is configured to be in contact with a conductive film 36b formed on an inner surface of a hole 36a of the upper side test board 36 in the second contact part B and configured that a generally V-shaped end portion is in contact with the terminal 30a of the test circuit board 30 at the third contact part C.

On the other hand, the contact terminal 16C shown in the center is formed with a long end portion, and is configured to be in contact with the lower side test circuit board 24 at the second contact part B and configured that a generally V-shaped end portion is in contact with the terminal 30a of the test circuit board 30 at the third contact part C. The contact terminal 16D shown on the right side does not have a bent portion of the middle portion, and, thus, does not have the second contact part B. That is, the contact terminal 16D is configured so that an upper end is connected to the external connection terminal 20a of the semiconductor device 20 and the end portion of on the opposite side contacts the terminal 30a of the test circuit board 30.

By selecting and using the above-mentioned contact terminals 16B, 16C and 16D if necessary, the external connection terminals 20a can be connected to the test circuit boards 24, 30 and 36. Thereby, for example, there is no need to produce a contactor substrate for each kind of the semiconductor device 20, and the contact substrate can be used in common.

It should be noted that the contactor substrate 18C may be formed by stacking substrates after forming each substrate separately, or may be formed in a single substrate as a multilayer substrate.

Figure 11:
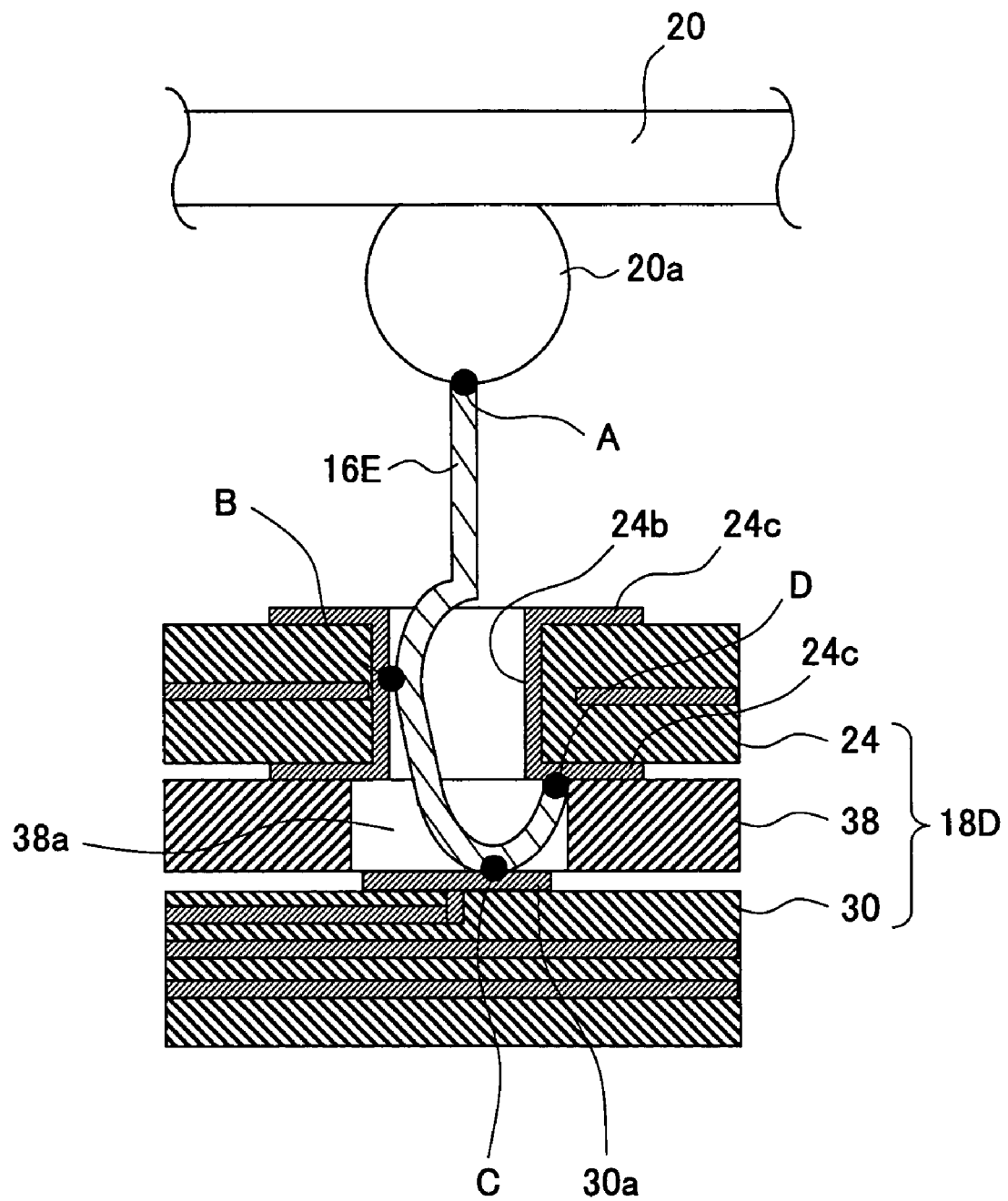
FIG. 11 is an enlarged cross-sectional view of a portion of a contactor according to a fourth embodiment of the present invention in which contact terminals are provided.

Next, a description will be given, with reference to FIG. 11, of a fourth embodiment of the present invention. FIG. 11 is an enlarged cross-sectional view of a part provided with a contact terminal of a contactor according to the fourth embodiment. In FIG. 11, parts that are the same as the parts shown in FIG. 6 are given the same reference numerals, and descriptions thereof will be omitted.

The contactor according to the present invention differs from the contactor shown in FIG. 6 in that an extreme end of a generally V-shaped end portion of the contact terminal 16E functions as the contact part D. In order to provide the fourth contact part D, the generally V-shaped end portion of the contact terminal 16E is made to be a larger shape than the generally V-shaped end portion of the contact terminal 16 shown in FIG. 6. Thereby, the generally V-shaped end portion of the contact terminal 16E contacts the land portion 24c formed as an extension part of the conductive film 24b of the test circuit board 24. This portion is the fourth contact part D. The hole 38a of the insulating substrate 38 is made larger than the hole 26a of the insulating substrate 26, and the extreme end of the generally V-shaped end portion of the contact terminal 16E can contact with the land portion 24c between the test circuit board 24 and the insulating substrate 36.

By providing the fourth contact part D as mentioned above, the contact with the test circuit board can be made more reliable, and reliability of the test can be improved.

Figure 12:
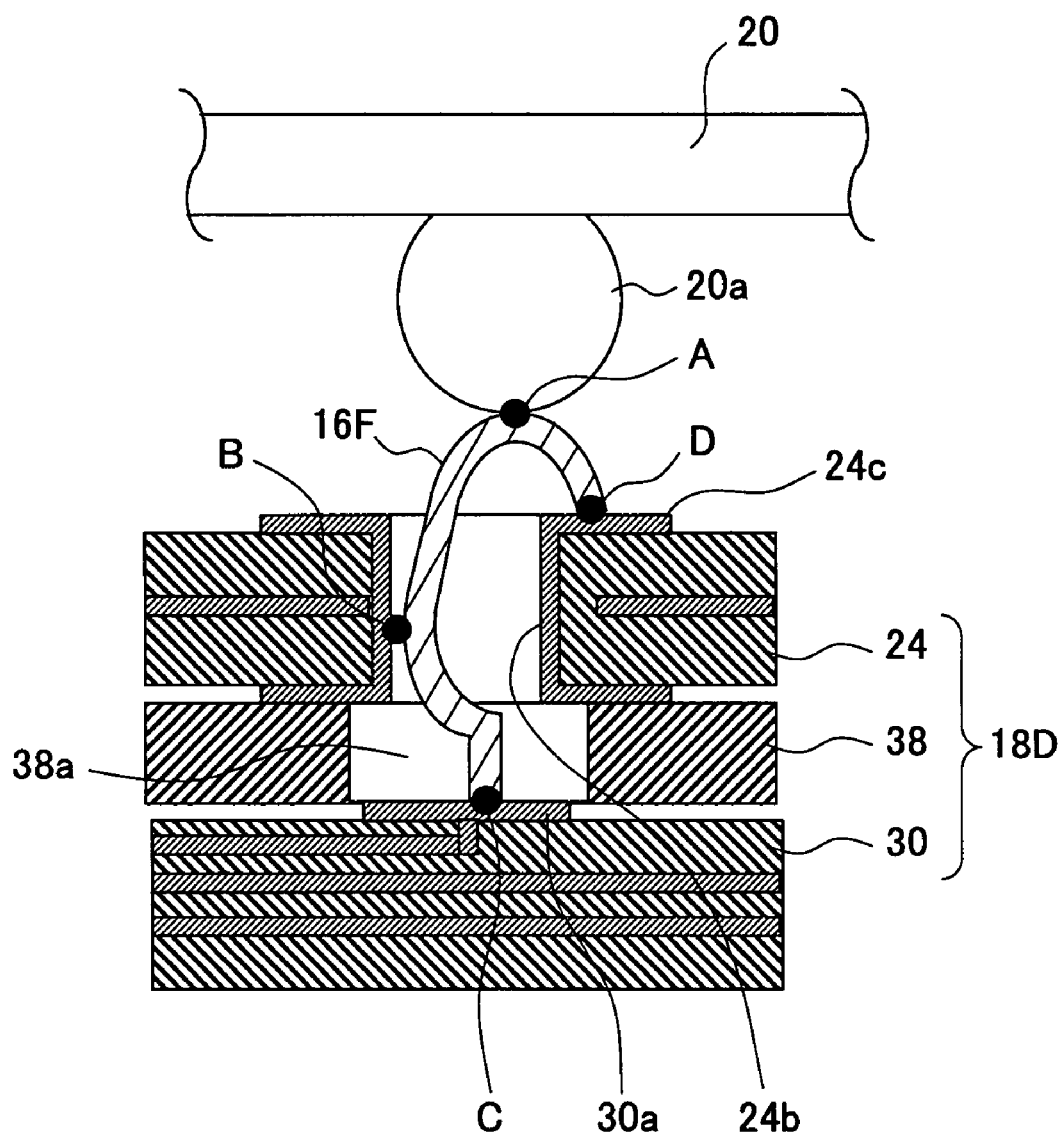
FIG. 12 is an enlarged cross-sectional view of a portion of a contactor according to a fifth embodiment of the present invention in which contact terminals are provided.

Next, a description will be given, with reference to FIG. 12, of a fifth embodiment of the present invention. FIG. 12 is an enlarged cross-sectional view of a portion in which a contact terminal of a contactor according to the fifth embodiment is provided. In FIG. 12, parts that are the same parts shown in FIG. 11 are given the same reference numerals, and descriptions thereof will be omitted.

In the present embodiment, the contract piece 16E shown in FIG. 11 is replaced with a contact terminal 16F having a different shape, and other parts are the same as the structure shown in FIG. 11. The contact terminal 16F has a shape which turns the contract piece 16E shown in FIG. 11 upside down, and a portion contacting the external connection terminal 20a of the semiconductor device 20 is a generally V-shaped end part. Then, an extreme end of the generally V-shaped end part contacts with a land portion 24c of the test circuit board 24, thereby forming a fourth contact part D.

By providing the fourth contact part D as mentioned above, a contact to the test circuit board can be made more reliable, and a reliability of test can be improved. Moreover, in the present embodiment, a distance between the first contact part A and the fourth contact part D is shorter than the distance between the first contact part A and the second contact part B, which enables to form a shorter conduction path.

As explained above, the present invention is suitable for a contactor for acquiring an electrical contact when performing a characteristic test of an electronic part such as a semiconductor device handling a high-frequency signal.

The present invention is not limited to the specifically disclosed embodiments and variations and modifications may be made without departing the scope of the present invention.

What is claimed is:

1. A contactor for electrically connecting terminals of an electronic part to an external circuit, comprising:

a contactor substrate having a plurality of holes; contact terminals each of which is formed by one piece of elongated electrically conductive material inserted into each of the holes of the contactor substrate so that a part protrudes from the hole; and an electrically conductive part formed on an inner surface of each of the holes, wherein each of said contact terminals has a first contact part that forms a first end of each contact terminal and makes physical contact with a respective one of said terminals of said electronic part, a first bent portion formed near a second end of each contact terminal, which is formed by one piece of the elongated electrically conductive material, the second end being opposite to the first end of each contact terminal, and a second contact part that is formed in a second bent portion formed by bending each contact terminal at a middle portion between the first contact part and the first bent portion so that the second contact part is displaced in a direction perpendicular to a direction of a pressing force when the pressing force is applied to the first end of each contact terminal, the second contact part being configured to contact said electrically conductive part at the middle portion of each contact terminal so as to electrically connect to said external circuit, and said contact terminals are interposed between said electronic part and said external circuit, and said contact terminals electrically connect said electronic part and said external circuit to each other.

2. The contactor as claimed in claim 1, wherein said first bent portion opposite to the first end of said contact terminal has a generally V-shape.

3. The contactor as claimed in claim 2, wherein said contactor substrate includes a first circuit board connected to said external circuit and an insulating substrate formed of an insulating material; the first circuit board and the insulating substrate are stacked; said hole extends to the insulating substrate by penetrating through the first circuit board;

and said electrically conductive part is provided on an inner surface of said hole formed in said first circuit board.

4. The contactor as claimed in claim 3, wherein said first bent portion of said contact terminal is arranged in said hole formed in said insulating substrate, and an extreme end of said first bent portion of said contact terminal contacts the inner surface of said hole formed in said insulating substrate.

5. The contactor as claimed in claim 4, wherein the extreme end of said first bent portion contacts the inner surface of said hole on a side opposite to said second contact part.

6. The contactor as claimed in claim 2, wherein said contactor substrate includes a first circuit board, an insulating substrate formed of an insulating material and a second circuit board; the first circuit board, the insulating substrate and the second circuit board are stacked; said hole extends by penetrating through the first circuit board and the insulating substrate; said electrically conductive part is provided on an inner surface of said hole formed in said first circuit board;

said second circuit board has a terminal at a position corresponding to a bottom part of said hole; and said second end portion of said contact terminal has a third contact part that contacts the terminal.

7. The contactor as claimed in claim 6, wherein said first bent portion of said contact terminal is arranged in said hole formed in said insulating substrate, and an extreme end of said first bent portion of said contact terminal contacts the inner surface of said hole formed in said insulating substrate.

8. The contactor as claimed in claim 7, wherein the extreme end of said first bent portion contacts the inner surface of said hole on a side opposite to said second contact part.

9. The contactor as claimed in claim 6, wherein an external circuit connected to said first circuit board is a processing circuit of a signal of which transmission rate is high, and an external circuit connected to said second circuit board is a circuit having a transmission rate lower than the processing circuit.

10. The contactor as claimed in claim 6, wherein said first circuit board and said second circuit board are set to be the same electric potential, and said first circuit board and said second circuit board are connected based on the Kelvin wiring.

11. The contactor as claimed in claim 6, wherein said first circuit board further has a land part that extends from said electrically conductive part formed on the inner surface of said hole and formed on a flat surface of said first circuit board, and an extreme end of said second end portion of said contact terminal contacts the land part.

12. The contactor as claimed in claim 2, wherein said contactor substrate includes a plurality of first circuit boards, a plurality of insulating substrates formed of an insulating material and a second circuit board; the plurality of first circuit boards and the plurality of insulating substrates are stacked alternately; said hole extends to the second circuit board by penetrating through the first circuit boards and the insulating substrates; said electrically conductive part is provided on an inner surface of said hole formed in said first circuit boards; said second circuit board has a terminal at a position corresponding to a bottom part of said hole; and said second end portion of said contact terminal has a third contact part that contacts the terminal.

13. The contactor as claimed in claim 12, wherein said second contact part of said contact terminal is provided selectively at a position to contact said electrically conductive film formed in one of said plurality of first circuit boards.

14. The contactor as claimed in claim 12, wherein said first bent portion of said contact terminal is arranged in said hole formed in said insulating substrates, and an extreme end of said first bent portion of said contact terminal contacts the inner surface of said hole formed in said insulating substrates.

15. The contactor as claimed in claim 2, wherein said contactor substrate includes a first circuit board, an electrically conductive substrate formed of an electrically conductive material and a second circuit board;

the first circuit board, the electrically conductive substrate and the second circuit board are stacked; said hole extends to said second circuit board by penetrating through the first circuit board and the electrically conductive substrate; said electrically conductive part is provided on an inner surface of said hole formed in said first circuit board; and an insulating part formed of a dielectric material is provided on the inner surface of said hole of said electrically conductive substrate.

16. The contactor as claimed in claim 15, wherein said first bent portion of said contact terminal is arranged in said hole formed in said electrically conductive substrate, and an extreme end of said first bent portion of said contact terminal contacts said insulating part of said electrically conductive substrate.

17. The contactor as claimed in claim 15, wherein an extreme end of said first bent portion contacts the inner surface of said hole on a side opposite to said second contact part.

* * * * *